United States Patent
Li

(10) Patent No.: US 9,366,709 B2
(45) Date of Patent: Jun. 14, 2016

(54) CIRCUIT AND METHOD FOR DELAY DIFFERENCE MEASUREMENT

(71) Applicant: TAIWAN SEMICONDUCTOR MANUFACTURING COMPANY LTD., Hsinchu (TW)

(72) Inventor: Shao-Yu Li, Hsinchu (TW)

(73) Assignee: TAIWAN SEMICONDUCTOR MANUFACTRURING COMPANY LTD., Hsinchu (TW)

( * ) Notice: Subject to any disclaimer, the term of this patent is extended or adjusted under 35 U.S.C. 154(b) by 433 days.

(21) Appl. No.: 14/027,598

(22) Filed: Sep. 16, 2013

(65) Prior Publication Data

US 2015/0077136 A1      Mar. 19, 2015

(51) Int. Cl.
| | |
|---|---|
| G01R 27/28 | (2006.01) |
| G01R 23/175 | (2006.01) |
| G01R 19/00 | (2006.01) |
| H03L 7/00 | (2006.01) |
| H03K 5/135 | (2006.01) |
| G01R 31/317 | (2006.01) |

(52) U.S. Cl.
CPC ............... *G01R 27/28* (2013.01); *H03K 5/135* (2013.01); *G01R 31/31725* (2013.01); *H03L 7/00* (2013.01)

(58) Field of Classification Search
CPC .. G01R 27/28; G01R 31/31725; H03K 5/135; H03K 5/06; H03L 7/00

USPC ..................... 324/617, 76.54, 76.11
See application file for complete search history.

(56) References Cited

U.S. PATENT DOCUMENTS

| | | | |
|---|---|---|---|
| 5,703,480 A * | 12/1997 | Zwack ....................... | 324/76.82 |
| 6,058,496 A | 5/2000 | Gillis et al. | |
| 7,453,255 B2 | 11/2008 | Sunter et al. | |
| 8,261,222 B2 | 9/2012 | Nakamura | |
| 8,489,947 B2 | 7/2013 | Sunter | |
| 8,664,978 B2 * | 3/2014 | Lu et al. .......................... | 327/43 |

FOREIGN PATENT DOCUMENTS

TW        I391687        4/2013

OTHER PUBLICATIONS

Office action dated Feb. 17, 2016 from counterpart Taiwan application No. 103109354.

* cited by examiner

*Primary Examiner* — Amy He
(74) *Attorney, Agent, or Firm* — WPAT, P.C., Intellectual Property Attorneys; Anthony King

(57) ABSTRACT

A circuit includes a signal generator, a delay pulse generator and a time-to-current converter. The signal generator is configured to generate a first signal including information on a rise delay and a second signal including information on a fall delay. A delay difference exists between the rise delay and the fall delay. The delay pulse generator is configured to provide an additional delay to one of the first and second signals. The time-to-current converter is configured to extract the delay difference.

20 Claims, 3 Drawing Sheets

CIRCUIT AND METHOD FOR DELAY DIFFERENCE MEASUREMENT

BACKGROUND

In some applications such as dynamic pattern generator (DPG) applications, to ensure sharp exposition, pixel bit cells are required to meet electrical performance specifications. One type of specification requires that delay difference |TDR−TDF| between a rise delay TDR and a fall delay TDF should be smaller than a certain duration (e.g., 500 picoseconds).

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAILED DESCRIPTION

Figure 1:
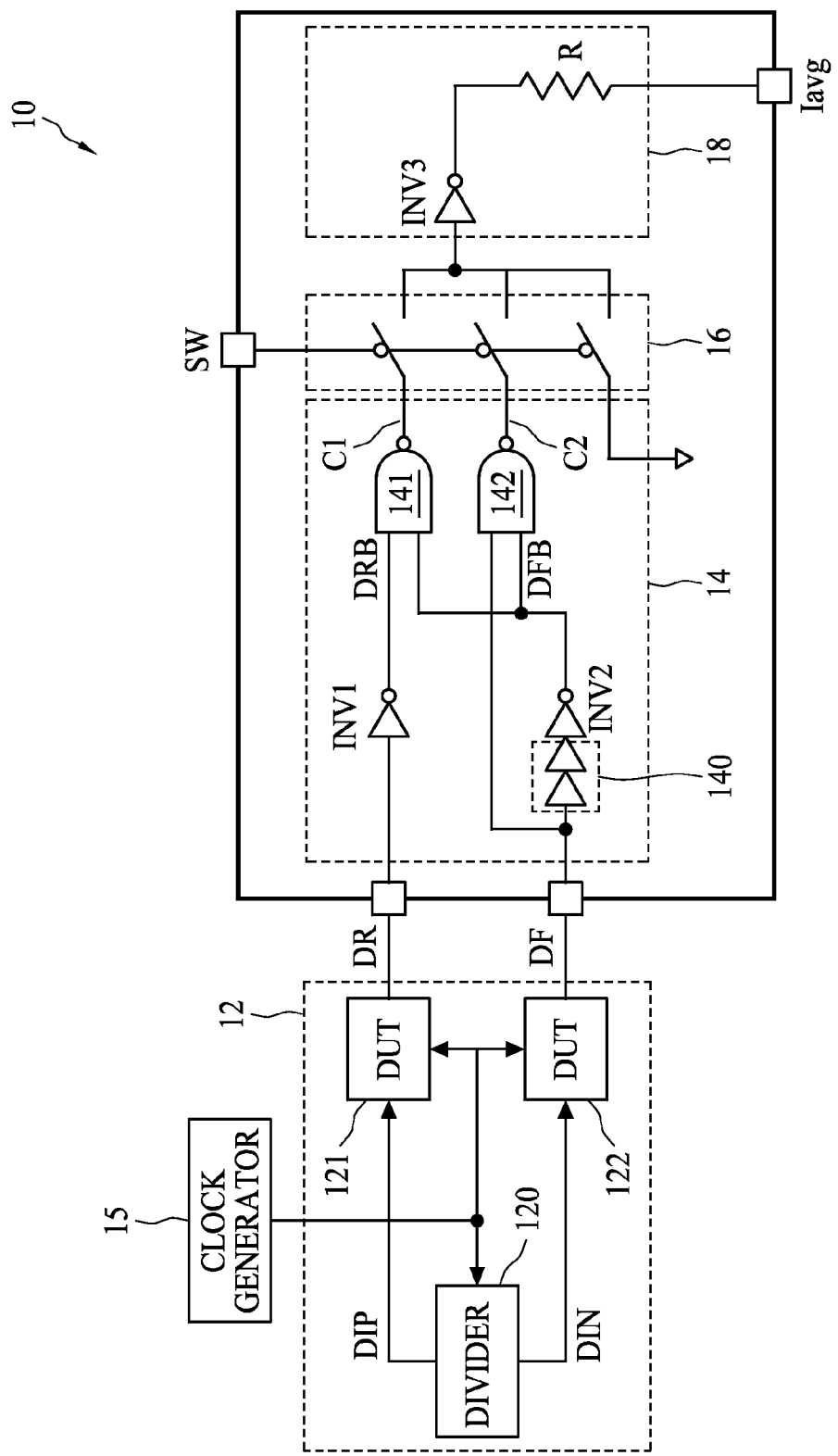
FIG. 1 is a schematic diagram of a circuit for delay difference measurement in accordance with some embodiments.

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number. It will be understood that when an element is referred to as being "connected to" or "coupled with" another element, it may be directly connected to or coupled to the other element, or intervening elements may be present.

FIG. 1 is a schematic diagram of a circuit 10 in accordance with some embodiments. Referring to FIG. 1, circuit 10 comprises a signal generator 12, a delay pulse generator 14, a switching device 16 and a time-to-current converter (TCC) 18.

Signal generator 12 is configured to generate a pair of signals DR and DF, which include information on a rise delay and a fall delay, respectively. Signal generator 12 includes a frequency divider 120, a first device under test (DUT) 121 and a second DUT 122, and generates signals DR and DF in response to a clock from a clock generator 15. Clock generator 15 simultaneously sends the clock to DUT 121, DUT 122 and frequency divider 120. Frequency divider 120 divides the frequency of the clock generated by clock generator 15, and is configured to provide a first data signal DIP and a second data signal DIN. In some embodiments, frequency divider 120 includes a divide-by-2 circuit and the clock has a 50% duty cycle. Effectively, first data signal DIP and second data signal DIN have opposite phases.

First DUT 121 receives first data signal DIP from frequency divider 120 and the clock from clock generator 15. In some embodiments, first DUT 121 includes a D-type flip flop, which in turn includes a data input port to receive first data signal DIP, and an enable port to receive the clock. Further, the D-type flip flop includes an inverse data output port, or $\overline{Q}$ port, connected to the data input port. First DUT 121 is configured to generate a first signal DR, which includes information on a rise delay.

Similarly, second DUT 122 receives second data signal DIN from frequency divider 120 and the clock from clock generator 15. In some embodiments, second DUT 122 includes a D-type flip flop, which in turn includes a data input port to receive second data signal DIN, and an enable port to receive the clock. Further, the D-type flip flop includes an inverse data output port, or $\overline{Q}$ port, connected to the data input port. Second DUT 122 is configured to generate a second signal DF, which includes information on a fall delay.

In some embodiments, first DUT 121 and second DUT 122 are fabricated in a same manufacturing process and thus exhibit substantially the same local variation. Accordingly, first DUT 121 and second DUT 122 may be deemed to have substantially the same rise delay and the same fall delay.

Delay pulse generator 14 is configured to generate an additional delay for the signals DR and DF so as to facilitate extraction of the delay difference, |TDR−TDF|, between the rise delay and fall delay, which will be discussed in detail with reference to FIG. 2. Delay pulse generator 14 includes first NAND device 141, second NAND device 142, first inverter INV1, second inverter INV2 and delay circuit 140.

First inverter INV1 includes an input to receive first signal DR, and an output to provide a signal DRB, which has an inverse logic state with respect to first signal DR. First inverter INV1 causes a logic delay, denoted as Tinv in FIG. 2, in the transmission of first signal DR towards first NAND device 141.

Delay circuit 140 includes an input to receive second signal DF, and an output coupled with an input of second inverter INV2. Delay circuit 140 provides a predetermined amount of delay, denoted as Tdelay in FIG. 2, for the second signal DF. In some embodiments, delay circuit 140 includes one or more buffers connected in series. Further, each buffer may include an even number of inverters connected in series.

In some embodiments, delay circuit 140 is coupled between first DUT 121 and first inverter INV1 rather than between second DUT 122 and second inverter INV2. As such, delay circuit 140 provides a predetermined amount of delay Tdelay for the first signal DR.

Second inverter INV2 includes an input coupled with the output of delay circuit 140, and an output, operating in conjunction with delay circuit 140, to provide a signal DFB, which has an inverse logic state with respect to second signal DF. Second inverter INV2 causes a logic delay, Tinv, in the transmission of second signal DF towards second NAND device 142.

First NAND device 141 includes an input, coupled with the output of first inverter INV1, to receive signal DRB. Moreover, first NAND device 141 includes another input, coupled with the output of second inverter INV2, to receive signal DFB. In operation, an output C1 of first NAND device 141 provides a low logic value when both of signals DRB and DFB are logically high, and provides a high logic value when at least one of signals DRB and DFB is logically low.

Second NAND device 142 includes an input, coupled with the input of delay circuit 140, to receive second signal DF. Moreover, second NAND device 142 includes another input, coupled with the output of second inverter INV2, to receive signal DFB. In operation, an output C2 of second NAND device 142 provides a low logic value when both of signals DF and DFB are logically high, and provides a high logic value when at least one of signals DF and DFB is logically low.

Switching device 16 is configured to selectively connect the output C1, the output C2 or a reference voltage (e.g., ground) to TCC 18 under the control of a control signal SW.

TCC 18 is configured to extract the delay difference |TDR−TDF|. TCC 18 includes a third inverter INV3 and an impedance element R. Third inverter INV3 includes an input to connect to one of the output C1, the output C2 and the reference voltage. Third inverter INV3 includes an output coupled with impedance element R. TCC 18 determines an unknown amount of time by measuring an average current magnitude associated with the unknown time and then comparing the average current magnitude with a known current magnitude associated with a known periodic signal over a predetermined period of time. The relationship between the unknown amount of time and the average current magnitude is expressed in an equation below:

$$Td = \frac{Iavg \times Tck}{Idc}$$

where Td represents an unknown amount of time, Iavg represents an average current magnitude associated with Td, Tck represents a predetermined period of a periodic signal having a known voltage amplitude and a known duty cycle, and Idc represents an average current magnitude associated with Tck.

For example, if the periodic signal Tck has a magnitude of VDC and a 100% duty cycle, which means that Tck is a direct-current (DC) voltage signal, an average current magnitude Idc associated with Tck can be measured at impedance element R. Given the predetermined period of Tck and the measured average current magnitude Idc, when another periodic signal with an unknown period Tdc is subsequently applied to TCC 18, an average current magnitude Iavg of the applied periodic signal is measured. By employing the above-mentioned equation, the unknown period Tdc can thereby be determined.

A time-to-current converter or time-to-current conversion method facilitates a designer to determine an amount of time, such as a relatively small delay, that would be difficult to measure by a direct measuring approach. An example of the time-to-current converter or time-to-current conversion method can be found in U.S. patent application under Publication No. 2013/0049810, entitled "Method and Apparatus for Time to Current Conversion," filed 30 Aug. 2011 and assigned to the same assignee of the subject application, which is hereby incorporated herein by reference.

TCC 18 works in conjunction with switching device 16 to determine an unknown period. In operation, the reference voltage, for example, ground voltage (represented by a low logic value), is connected to TCC 18 by switching device 16. By operation of third inverter INV3, voltage represented by a high logic value is generated at the output of third inverter INV3 and causes a current to flow through impedance element R. The current is measured for a predetermined period Tck so that an average current magnitude Idc is determined in the predetermined period Tck.

Switching device 16 may then connect the output C1 to TCC 18. When a signal SC1 at the output C1 is logically low, by operation of third inverter INV3, a current flows through impedance element R. As a result, an average current magnitude Ic1 associated with signal SC1 is determined.

Likewise, switching device 16 connects the output C2 to TCC 18. When a signal SC2 at the output C2 is logically low, by operation of third inverter INV3, a current flows through impedance element R. As a result, an average current magnitude Ic2 associated with signal SC2 is determined. Subsequently, based on the predetermined period Tck, and the average current magnitudes Idc, Ic1 and Ic2, a delay difference between a rise delay and a fall delay is determined, which will be discussed in detail with reference to FIG. 2.

Accordingly, circuit 10 generates signal DR including information on a rise delay TDR and signal DF including information on a fall delay TDF at the same time. Since it may be difficult to directly measure the delay difference, |TDR−TDF|, circuit 10 provides an additional delay Tdelay to one of signals DR and DF, measures average current magnitudes Ic1 and Ic2 associated with signals DR and DF, respectively, and determines the delay difference |TDR−TDF| based on the average current magnitudes Ic1 and Ic2.

Figure 2:
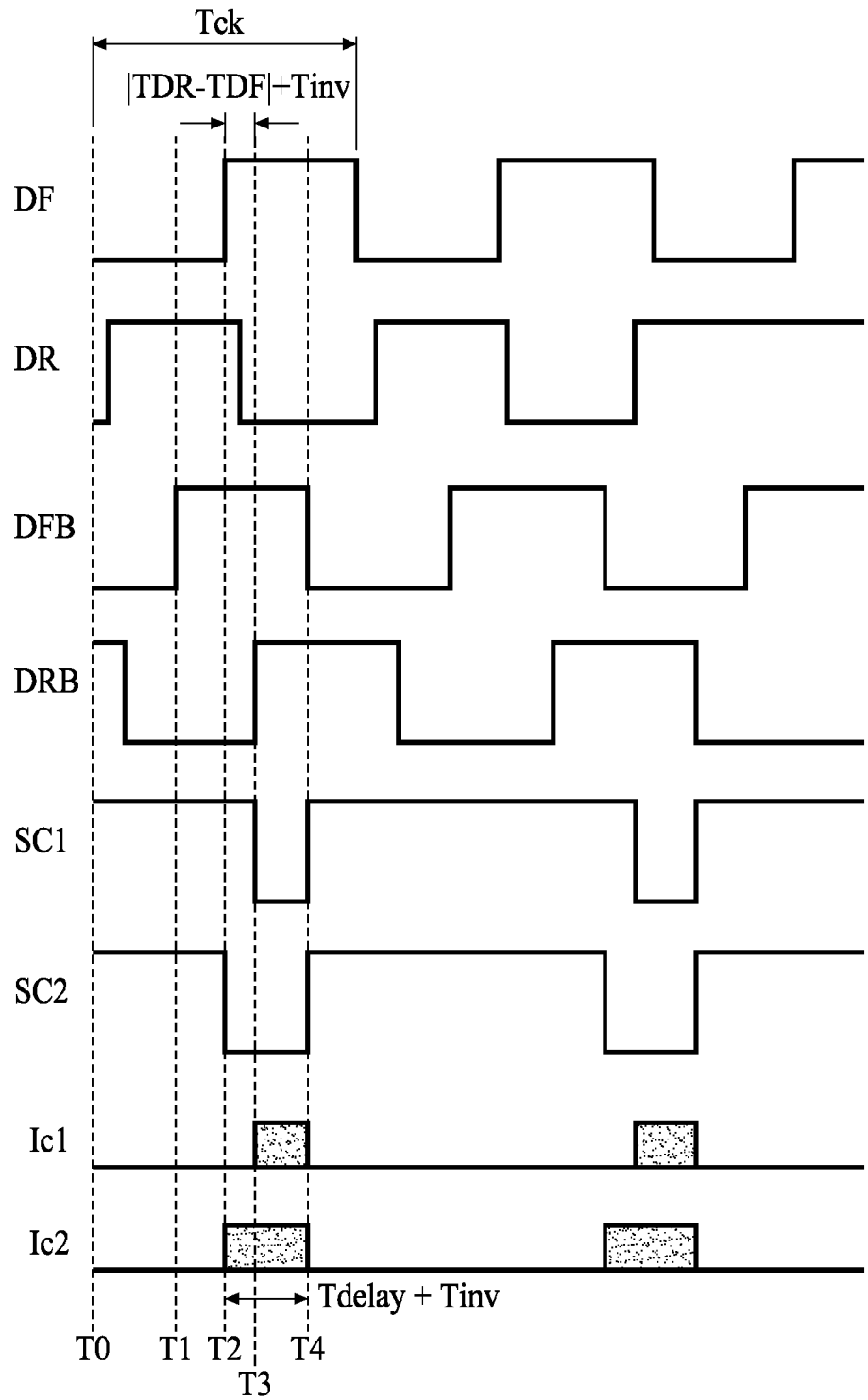
FIG. 2 shows illustrative signals corresponding to the circuit in FIG. 1, in accordance with some embodiments.

FIG. 2 shows illustrative signals corresponding to circuit 10 in FIG. 1, in accordance with some embodiments. Referring to FIG. 2, at time T0, signals DR and DF including information on rise delay TDR and fall delay TDF, respectively, are simultaneously generated. Signals DR and DF would have substantially opposite phases but for the delay difference between signals DR and DF.

At times T1, T2 and T3, signals DFB, DF and DRB become logically high, respectively. As previously discussed, the output C1 of first NAND device 141 provides a low logic value when both of signals DRB and DFB are logically high. Since signals DRB and DFB are both logically high in a period from time T3 to time T4, signal SC1 at the output C1 accordingly is logically low in the period from time T3 to time T4 in a predetermined period Tck. Moreover, since there is a delay difference |TDR−TDF| between signals DR and DF, and further since signal DRB lags behind signal DR by Tinv due to first inverter INV1, signal DRB thus lags behind signal DF by (|TDR−TDF|+Tinv), which equals to a period from time T2 to time T3.

Further, the output C2 of second NAND device 142 provides a low logic value when both of signals DF and DFB are logically high. Since signals DF and DFB are both logically high in a period from time T2 to time T4, signal SC2 at the output C2 accordingly is logically low in the period from time T2 to time T4 in the predetermined period Tck. Moreover, as previously discussed, by operation of delay circuit 140 and second inverter INV2, signal DFB lags behind signal DF by a total delay of (Tdelay+Tinv), which equals the period from time T2 to time T4. As a result, a period of time TSC2 that signal SC2 maintains logically low in the predetermined period Tck is expressed in equation (1) below.

$$TSC2 = T\text{delay} + T\text{inv} \qquad \text{equation (1)}$$

Further, a period of time TSC1 that signal SC1 maintains logically low in the predetermined period Tck is expressed in equation (2) below.

$$TSC1 = T\text{delay} + T\text{inv} - (|TDR-TDF| + T\text{inv}) = T\text{delay} - |TDR-TDF| \qquad \text{equation (2)}$$

As also previously discussed, by connecting the reference voltage to TCC 18 under the control of switching device 16, average current magnitude Idc associated with the predetermined period Tck is determined. Further, average current magnitude Ic1 associated with TSC1 and average current magnitude Ic2 associated with TSC2 are determined by selectively connecting the outputs C1 and C2 to TCC 18, respectively. Accordingly, delay difference |TDR−TDF| is determined by equation (3) below.

$$|TDR-TDF| = \frac{|\rho \cdot Ic2 - Ic1| \times Tck}{Idc} \text{ where } \rho = \frac{Tdelay}{Tdelay + Tinv},$$

a weight to adjust the different time bases of TSC1 and TSC2 in calculating the delay difference based on Ic1 and Ic2. In FIG. 2, for illustration, Ic1 and Ic2 have significant overlap in the time domain. However, Ic1 and Ic2 are not switched in at the same time and may be measured in different clock cycles. To facilitate a better understanding of weight p, Ic2 is relocated with respect to Ic1 to the present clock cycle labeled Tck.

Figure 3:
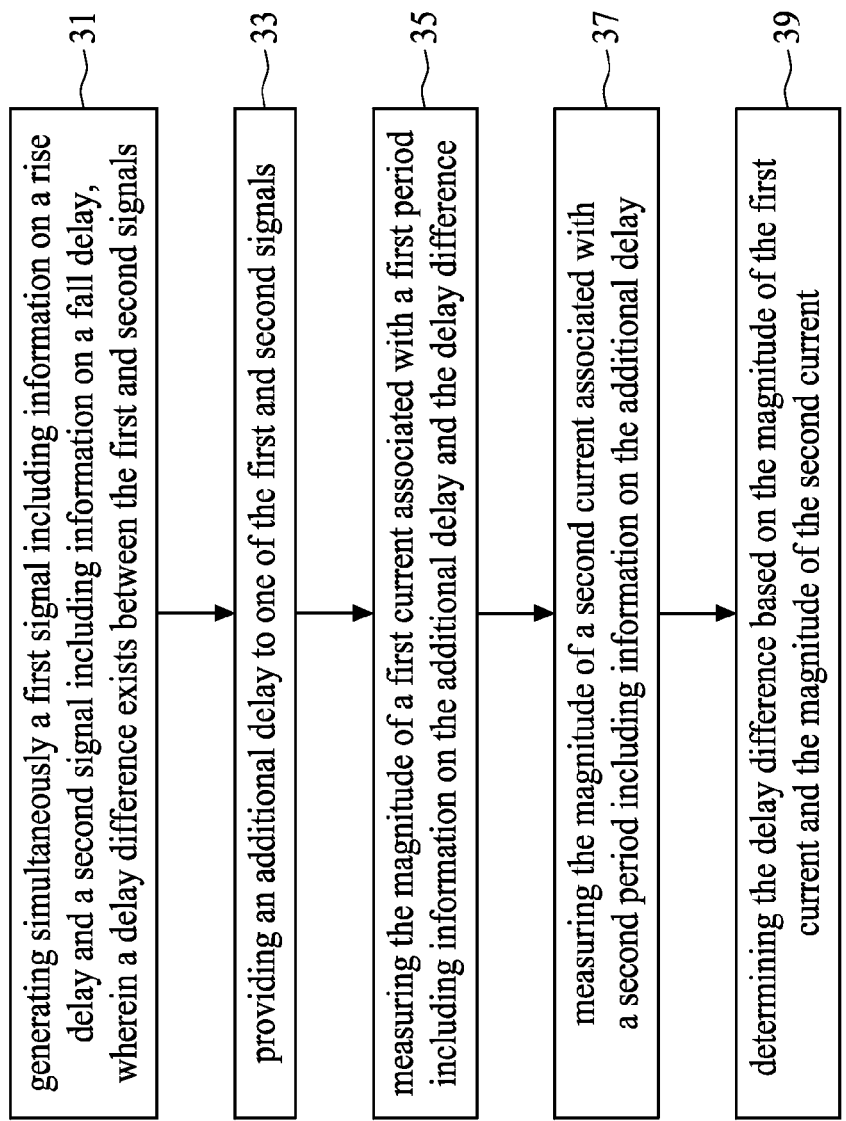
FIG. 3 is a flow diagram illustrating a method of delay difference measurement in accordance with some embodiments.

FIG. 3 is a flow diagram illustrating a method of delay difference measurement in accordance with some embodiments. Referring to FIG. 3, in operation 31, a first signal DR including information on a rise time TDR and a second signal DF including information on a fall time TDF are substantially simultaneously generated. A delay difference |TDR-TDF| exists between first and second signals DR and DF.

In operation 33, an additional delay Tdelay is provided to one of first and second signals DR and DF.

In operation 35, the magnitude of a first current Ic1 associated with a first period of time TSC1 within a predetermined period Tck is measured. First period of time TSC1 includes information on the additional delay Tdelay and the delay difference |TDR-TDF|. In some embodiments, first period of time TSC1 is expressed as TSC1=Tdelay-TDR-TDF|.

In operation 37, the magnitude of a second current Ic2 associated with a second period TSC2 within the predetermined period Tck is measured. Second period of time TSC2 includes information on the additional delay Tdelay. In some embodiments, second period of time TSC2 is expressed as TSC2=Tdelay+Tinv.

In operation 39, the delay difference |TDR-TDF| is determined based on the magnitudes of the first and second currents Ic1 and Ic2. In some embodiments, delay difference |TDR-TDF| is expressed in an equation below.

$$|TDR-TDF| = \frac{|\rho \cdot Ic2 - Ic1| \times Tck}{Idc} \text{ where } \rho = \frac{Tdelay}{Tdelay + Tinv}.$$

In some embodiments of the present disclosure, a circuit 10 comprises a signal generator 12, a delay pulse generator 14 and a time-to-current converter 18. Signal generator 12 is configured to generate a first signal DR including information on a rise delay TDR and a second signal DF including information on a fall delay TDF, wherein a delay difference |TDR-TDF| exists between the rise delay TDR and the fall delay TDF. Delay pulse generator 14 is configured to provide an additional delay Tdelay to one of the first and second signals DR and DF. Time-to-current converter 18 is configured to extract the delay difference |TDR-TDF|.

In other embodiments of the present disclosure, a circuit 10 comprises a first input, a second input, a delay circuit 140, a first output, a second output and a time-to-current converter 18. The first input receives a first signal DR including information on a rise delay TDR. The second input receives a second signal DF including information on a fall delay TDF, wherein a delay difference |TDR-TDF| exists between the rise delay TDR and the fall delay TDF. Delay circuit 140 is configured to provide an additional delay Tdelay to one of the first and second signals DR and DF. Circuit 10 provides at the first output a first periodic signal SC1 having a first period of time TSC1 including information on the delay difference |TDR-TDF| and the additional delay Tdelay. Circuit 10 provides at the second output a second periodic signal SC2 having a second period of time TSC2 including information on the additional delay Tdelay. Time-to-current converter 18 is configured to extract the delay difference |TDR-TDF| based on the first and second periodic signals SC1 and SC2.

In some embodiments of the present disclosure, a method comprises generating simultaneously a first signal DR including information on a rise delay TDR and a second signal DF including information on a fall delay TDF, wherein a delay difference |TDR-TDF| exists between the first and second signals DR and DF, providing an additional delay Tdelay to one of the first and second signals DR and DF, measuring the magnitude of a first current Ic1 associated with a first period of time TSC1 including information on the delay difference |TDR-TDF| and the additional delay Tdelay, measuring the magnitude of a second current Ic2 associated with a second period of time TSC2 including information on the additional delay Tdelay, and determining the delay difference |TDR-TDF| based on the magnitude of the first current Ic1 and the magnitude of the second current Ic2.

A number of embodiments of the disclosure have been described. It will nevertheless be understood that various modifications may be made without departing from the spirit and scope of the disclosure. For example, some signals are illustrated with a particular logic level, but selecting such levels are also a matter of design choice, and embodiments of the disclosure are applicable in various design choices.

The above description includes exemplary operations, but these operations are not necessarily required to be performed in the order shown. Operations may be added, replaced, changed order, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. A circuit, comprising:
    a signal generator configured to generate a first signal including information on a rise delay and a second signal including information on a fall delay, wherein a delay difference exists between the rise delay and the fall delay;
    a delay pulse generator configured to provide an additional delay to one of the first or second signals; and
    a time-to-current converter configured to extract the delay difference.

2. The circuit of claim 1, wherein the signal generator includes a frequency divider configured to divide a clock from a clock generator.

3. The circuit of claim 2, wherein the frequency divider includes a divide-by-2 circuit.

4. The circuit of claim 1, wherein the delay pulse generator includes a delay circuit configured to provide the additional delay.

5. The circuit of claim 1, wherein the delay pulse generator includes a first NAND circuit including an input to receive the first signal via a first inverter, and another input to receive the second signal via a second inverter.

6. The circuit of claim 5, wherein the delay pulse generator includes a second NAND circuit including an input to receive the second signal, and another input to receive the second signal via the second inverter.

7. The circuit of claim 6, wherein the time-to-current converter includes a third inverter and an impedance element coupled to an output of the third inverter.

8. The circuit of claim 7 further comprising a switching device configured to selectively connect one of an output of the first NAND circuit, an output of the second NAND circuit or a reference voltage to the time-to-current converter.

9. A circuit, comprising:
a first input to receive a first signal including information on a rise delay;
a second input to receive a second signal including information on a fall delay, wherein a delay difference exists between the rise delay and the fall delay;
a delay circuit configured to provide an additional delay to one of the first and second signals;
a first output to provide a first periodic signal having a first period of time including information on the delay difference and the additional delay;
a second output to provide a second periodic signal having a second period of time including information on the additional delay; and
a time-to-current converter configured to extract the delay difference based on the first and second periodic signals.

10. The circuit of claim 9 further comprising a signal generator configured to generate the first and second signals.

11. The circuit of claim 10, wherein the signal generator includes a frequency divider configured to divide a clock from a clock generator.

12. The circuit of claim 11, wherein the frequency divider includes a divide-by-2 circuit.

13. The circuit of claim 9 further comprising a first NAND circuit including an input to receive the first signal via a first inverter, and another input to receive the second signal via a second inverter.

14. The circuit of claim 13 further comprising a second NAND circuit including an input to receive the second signal, and another input to receive the second signal via the second inverter.

15. The circuit of claim 14, wherein the time-to-current converter includes a third inverter and an impedance element coupled to an output of the third inverter.

16. The circuit of claim 15 further comprising a switching device configured to selectively connect one of an output of the first NAND circuit, an output of the second NAND circuit and a reference voltage to the time-to-current converter.

17. A method, comprising:
generating simultaneously a first signal including information on a rise delay and a second signal including information on a fall delay, wherein a delay difference exists between the first and second signals;
providing an additional delay to one of the first and second signals;
measuring the magnitude of a first current associated with a first period of time including information on the delay difference and the additional delay;
measuring the magnitude of a second current associated with a second period of time including information on the additional delay; and
determining the delay difference based on the magnitude of the first current and the magnitude of the second current.

18. The method of claim 17 further comprising:
providing a periodic signal having a known period; and
measuring an average current magnitude associated with the periodic signal.

19. The method of claim 18, wherein the periodic signal includes a 100% duty cycle.

20. The method of claim 17, wherein generating simultaneously the first and second signals includes dividing the frequency of a clock by two.

* * * * *